United States Patent [19]

Okuda

[11] Patent Number: 4,623,907
[45] Date of Patent: Nov. 18, 1986

[54] SEMICONDUCTOR LIGHT-EMITTING DEVICE

[75] Inventor: Hiroshi Okuda, Osaka, Japan

[73] Assignee: Sumitomo Electric Industries, Ltd., Osaka, Japan

[21] Appl. No.: 662,043

[22] Filed: Oct. 18, 1984

[30] Foreign Application Priority Data

Oct. 19, 1983 [JP] Japan ................................ 58-195529

[51] Int. Cl.$^4$ ............................................ H01L 33/00
[52] U.S. Cl. ......................................... 357/17; 357/16
[58] Field of Search ....................... 372/45; 357/17, 16

[56] References Cited

U.S. PATENT DOCUMENTS 4,132,960 1/1979 Streifer et al. ......................... 372/45

OTHER PUBLICATIONS

Arai et al., "1.67 μm Ga$_{0.47}$-In$_{0.53}$ As/InP DH Laser Double Cladded with InP by LPE Technique", *JPN. J. Appl. Physics*, vol. 18 (1979), No. 3, p. 709–710.
Arai et al., Room Temperature CW Operation of 1.5–1.6 μm Wavelength Range GaInAsP/InP Lasers, Conference; Integrated and Guided Wave Optics Technical Digest, Jan. 28–30, 1980.
Wright et al., InGaAsP–InP Double-Heterojunction High Radiance LED's, IEEE Transaction on Electron Devices, vol. ED-26, Nov. 8, Aug. 1979.
H. Grothe et al., "Influence of Mg Doping on Cutoff Frequency and Light Output of InGaAsP/InP Heterojunction LED's" IEEE Transactions on Electron Devices, vol. ED-28, No. 4, 1981, pp. 371–373.
A. Suzuki et al., "500 Mbit/s Transmission Experiment Using 1.3 μm Wavelength InGaAsP/InP High–Speed Surface-Emitting DH LEDs", Electronics Letters, vol. 19, No. 23 (1983) pp. 963–965.
A. Suzuki et al., "Pulse Response and Photo Output Characteristic of 1.3 μm Band High Speed LED", p. 135.

*Primary Examiner*—James W. Davie
*Assistant Examiner*—Georgia Y. Epps
*Attorney, Agent, or Firm*—Cushman, Darby & Cushman

[57] ABSTRACT

A semiconductor light-emitting device according to the present invention is made by forming an undoped In$_{1-x}$Ga$_x$As$_{1-y}$P$_y$ active layer on a n-InP clad layer, a p-In$_{1-x}$Ga$_x$As$_{1-y}$P$_y$ active layer on said undoped active layer, and a p—n junction position in the interface between said n-InP layer and said undoped In$_{1-x}$Ga$_x$As$_{1-y}$P$_y$ active layer or in the neighborhood thereof. By this structure, the heretofore inevitable problem of remote junction can be solved and the half value width of the light-emitting spectrum can be reduced. Therefore, the semiconductor light-emitting device according to the present invention provides higher response frequency and larger light-emitting output than the conventional semiconductor light-emitting device.

4 Claims, 12 Drawing Figures

- p-In₁₋wGawAs₁₋zPz Contact Layer, 6
- p-InP Clad Layer, 5
- p-In₁₋xGaxAs₁₋yPy Active Layer, 4
- n-InP Layer, 2
- n-InP Substrate, 1

SEMICONDUCTOR LIGHT-EMITTING DEVICE

BACKGROUND OF THE INVENTION

1. Field of the Art

This invention relates to a semiconductor light-emitting device.

2. Prior Art

In a prior art high-speed responding light-emitting diode of double-hetero structure type of $In_{1-x}Ga_xAs_{1-y}P_y/InP$, it was a conventional practice to dope p—$In_{1-x}Ga_xAs_{1-y}P_y$ active layer with Zn which is a p-type impurity in the high density of $3-10 \times 10^{18}$ cm$^{-3}$ and to make this active layer grow epitaxially on n-type InP clad layer to thereby increase the response speed (see, for examples, Electronics Letters, 1983, Vol. 19 No. 23, pp 963–965 and The Preprints 6P-H-8 for 30th Lectures of Federation of Applied Physics Societies, Spring 1983). In FIG. 1, reference numeral 1 denotes n-InP substrate doped with Te in the density of $1 \times 10^{18}$ cm$^{-3}$, 5 denotes p-InP clad layer doped with Zn in the density of $3 \times 10^{18}$ cm$^{-3}$, and 6 denotes p-$In_{1-w}Ga_wAs_{1-z}P_z$ contact layer doped with Zn in the density of $3 \times 10^{18}$ cm$^{-3}$.

FIG. 2 shows carrier density profile of the layers of the light-emitting diode having the structure shown in FIG. 1. In FIG. 2, numerals 1, 2, 4, 5 and 6 along the horizontal axis correspond to the reference numerals 1, 2, 4, 5 and 6 denoting the layers of the structure of FIG. 1. Since the p-$In_{1-x}Ga_xAs_{1-y}P_y$ active layer 4 is doped with Zn, a p-type impurity, in the high density, Zn is diffused to the n-InP clad layer 2 during the epitaxial growth as shown by the broken line in FIG. 2, to make a portion of the n-InP clad layer 2 p-InP. For this reason, there is caused a remote junction in which the p-n junction is shifted from the interface between the p-$In_{1-x}Ga_xAs_{1-y}P_y$ active layer 4 and the n-InP clad layer 2 into the n-InP clad layer 2.

FIG. 3 shows energy band profile of the layers of FIG. 2. In FIG. 3, reference numerals 1, 2, 4, 5 and 6 along the horizontal axis correspond to the reference numerals 1, 2, 4, 5 and 6, respectively, denoting the layers in FIGS. 1 and 2. When the junction is shifted into the n-InP clad layer 2 as shown in FIG. 3, a portion of the carriers flow out from the p-$In_{1-x}Ga_xAs_{1-y}P_y$ active layer 4 which is the light-emitting region into the n-InP clad layer, to thereby reduce the light-emitting output.

Further, since the remote junction makes the carrier enclosure incomplete, reduction in the response speed is inevitable even when the p-type impurity Zn is doped in a high density.

To avoid the remote junction, it is conventional to provide sequentially the n-InP layer 2 on the n-InP substrate 1, the undoped $In_{1-x}Ga_xAs_{1-y}P_y$ active layer 3 on the n-InP layer 2, a p-InP clad layer 5' doped with Zn in a high density on the active layer 3, and the p-$In_{1-w}Ga_wAs_{1-z}P_z$ contact layer 6 on the p-InP clad layer 5'. FIG. 4 shows carrier density profile of the light-emitting diode having the sequentially provided layers as described above. As shown by a broken line in FIG. 4, a p—n junction is formed in the active layer 3 by diffusing Zn from the p-InP clad layer 5' into the $In_{1-x}Ga_xAs_{1-y}P_y$ active layer 3 during growth of crystal. In the light-emitting device produced by the method described above, however, a half value width of the light-emitting spectrum is enlarged as shown in the curve (b) of FIG. 5. This is becuase, in the above-described method, Zn is diffused substantially over the entire region of the $In_{1-x}Ga_xAs_{1-y}P_y$ active layer 3 so as to distort the crystal of the $In_{1-x}Ga_xAs_{1-y}P_y$ active layer, or, even in the case where Zn is not diffused over the entire region, the p-n junction is formed in about the middle of the $In_{1-x}Ga_xAs_{1-y}P_y$ active layer 3.

The light-emitting device produced in the method described above is, in spite of its high response speed, not suitable for high speed data transmission through optical fibers because of the large half value width of its light-emitting spectrum. That is, the data transmittable distance through optical fibers depends upon the half value width of the light-emitting spectrum of the light-emitting device as shown in FIG. 6. In the case where the half value width is 160 nm as shown by the curve (b) in FIG. 5, data transmission over a distance of 0.8 km or larger is practically impossible as shown by a broken conventional light-emitting device produced by Zn diffusion as described above has a further disadvantage that uneven Zn diffusion in the $In_{1-x}Ga_xAs_{1-y}P_y$ active layer 3 in the production process causes variation in characteristics of the device.

SUMMARY OF THE INVENTION

Accordingly, an object of the present invention is to provide a semiconductor light-emitting device having an increased response speed and an intensified light-emitting output.

Another object of the present invention is to provide a semiconductor light-emitting device having a narrowed half value width of light-emitting spectrum.

In order to achieve the above-mentioned objects, the light-emitting device according to the present invention is provided with an n-InP clad layer, an undoped $In_{1-x}Ga_xAs_{1-y}P_y$ active layer formed in a predetermined thickness on the n-InP clad layer, and a p-$In_{1-x}Ga_xAs_{1-y}P_y$ active layer formed on the undoped $In_{1-x}Ga_xAs_{1-y}P_y$ active layer. Further, a p-n junction position is formed on the interface or in the neighborhood thereof between the n-InP layer and the undoped $In_{1-x}Ga_xAs_{1-y}P_y$ active layer. The structure described above has overcome the difficulty of the conventional light-emitting device, that is the remote junction in which the p-n junction position is formed within the n-InP clad layer. Accordingly, the light-emitting device according to the present invention has important characteristics such as high response speed and light-emitting output and a small half value width of light-emitting spectrum and is used as a semiconductor light-emitting device suitable for high speed data transmission through optical fibers.

Further, since the p-n junction position is formed easily on the interface or in its neighborhood between the n-InP clad layer and the undoped $In_{1-x}Ga_xAs_{1-y}P_y$ active layer, control is easily performed during growth of crystal and yield rate and reliability of the device can be greatly increased.

BRIEF DESCRIPTION OF THE DRAWINGS

The invention will be better understood from the following description taken in connection with the accompanying drawings in which.

DESCRIPTION OF THE PREFERRED EMBODIMENTS

Figure 7:
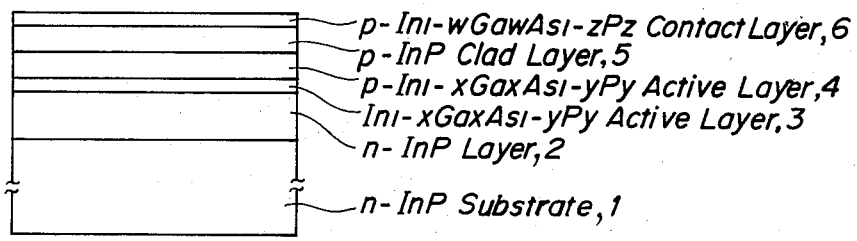
FIG. 7 is a sectional view showing the structure of an embodiment of the present invention.

With reference now to the drawings, a preferred embodiment of the present invention will be described in detail. FIG. 7 shows a structure of a semiconductor light-emitting device according to the present invention, in which reference numeral 1 denotes an n-InP substrate doped with Te in the density of $1 \times 10^{18}$ cm$^{-3}$. On the n-InP substrate 1, there is formed an n-InP clad layer 2 doped with Te in the density of $1 \times 10^{18}$ cm$^{-3}$, in the thickness of 5 μm by epitaxial growth. On the n-InP clad layer 2, there is formed an undoped $In_{1-x}Ga_xAs_{1-y}P_y$ active layer 3 in the thickness of 0.5 μm by epitaxial growth. On the $In_{1-x}Ga_xAs_{1-y}P_y$ active layer 3, there is formed a p-$In_{1-x}Ga_xAs_{1-y}P_y$ active layer 4 doped with Zn in the density of $5 \times 10^{18}$ cm$^{-3}$, in the thickness of 1 μm by epitaxial growth. On the p-$In_{1-x}Ga_xAs_{1-y}P_y$ active layer 4, there is formed a p-InP clad layer 5 doped with Zn in the density of $3 \times 10^{18}$ cm$^{-3}$, in the thickness of 1 μm by epitaxial growth. On the p-InP clad layer 5, there is formed a p-$In_{1-w}Ga_wAs_{1-z}P_z$ contact layer 6 doped with Zn in the density of $3 \times 10^{18}$ cm$^{-3}$, in the thickness of 1 μm by epitaxial growth. In this manner, these layers 2, 3, 4, 5 and 6 are formed sequentially by epitaxial growth.

As described above, when the undoped $In_{1-x}Ga_xAs_{1-y}P_y$ active layer 3 is epitaxially grown in the thickness of 0.5 μm and, thereafter, the Zn-doped p-$In_{1-x}Ga_xAs_{1-y}P_y$ active layer 4 and p-InP clad layer 5 are sequentially epitaxially grown, Zn in the Zn-doped p-$In_{1-x}Ga_xAs_yP_y$ active layer 4 is diffused in the thickness of 0.5 μm into the undoped $In_{1-x}Ga_xAs_{1-y}P_y$ active layer 3.

Figure 1:
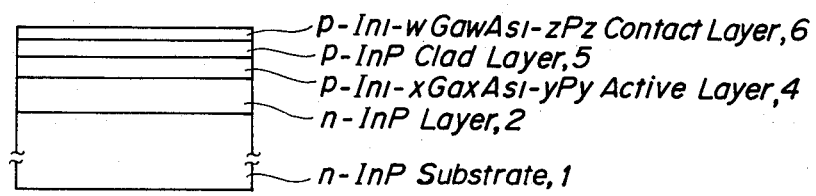
FIG. 1 is a sectional view showing the structure of a conventional semiconductor light-emitting device.
Figure 2:
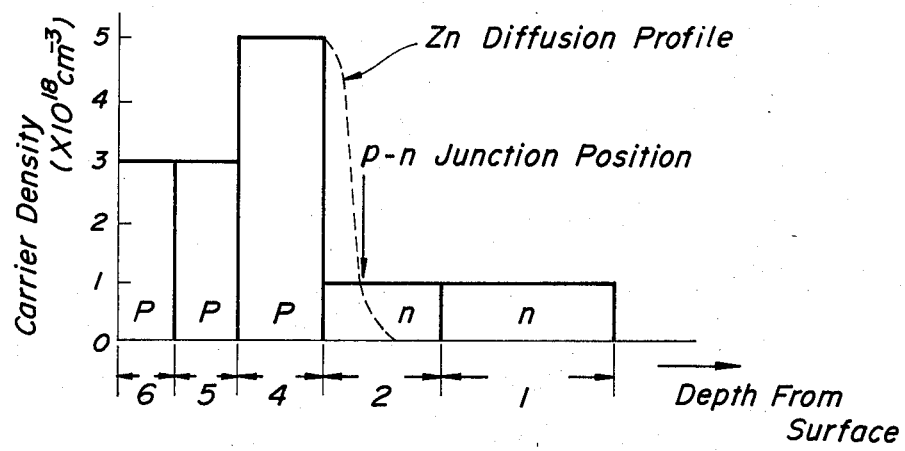
FIG. 2 is an illustration of the carrier density profile of the layers of the device shown in FIG. 1 and the junction position thereof.
Figure 3:
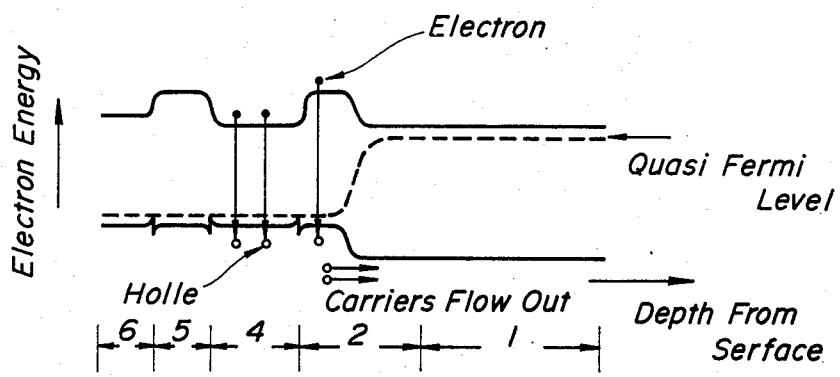
FIG. 3 is an illustration of the band profile of the layers of the device shown in FIG. 1.
Figure 4:
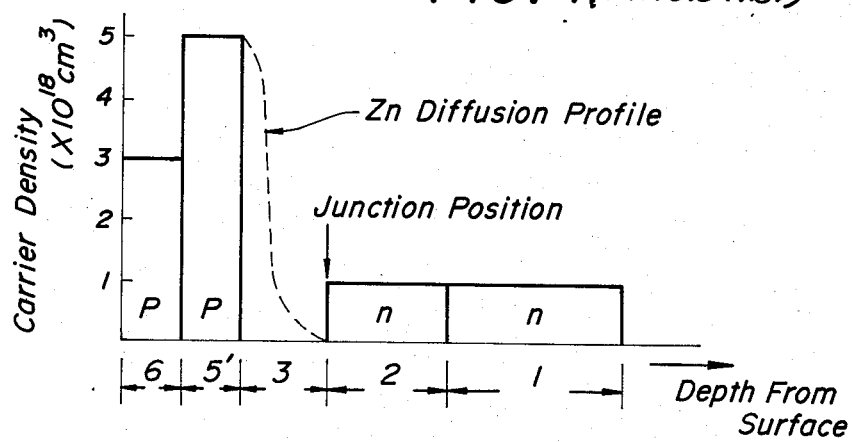
FIG. 4 is an illustration of the carrier density profile of the layers of another conventional semiconductor light-emitting device and the junction position thereof.
Figure 5:
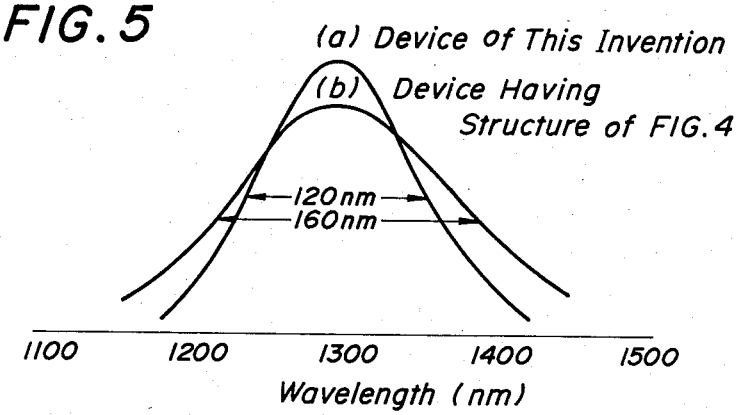
FIG. 5 is a characteristics diagram of the light-emitting spectrum.
Figure 6:
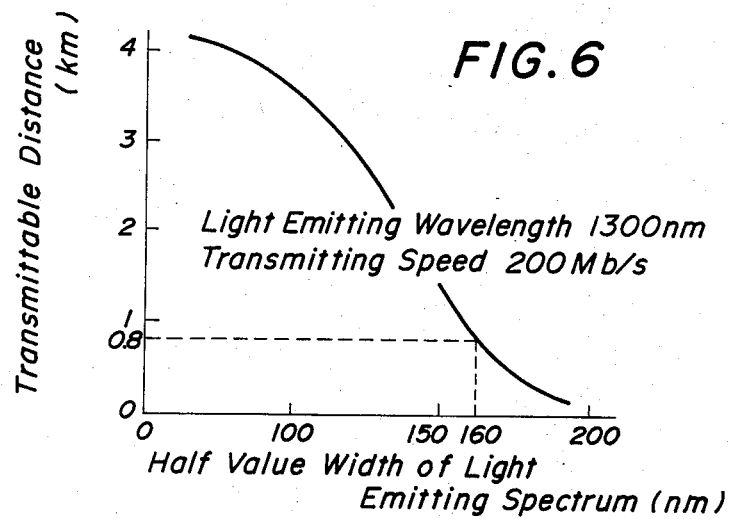
FIG. 6 is a graph showing the relationship between the transmittable distance and the half value width of the light-emitting spectrum during high speed modulation.
Figure 8:
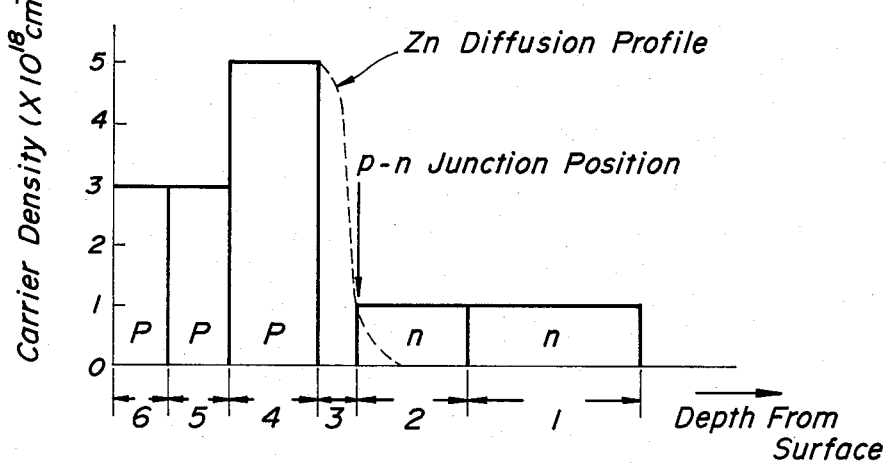
FIG. 8 is an illustration of the carrier density profile of the layers of the device shown in FIG. 7 and the junction position thereof.
Figure 9:
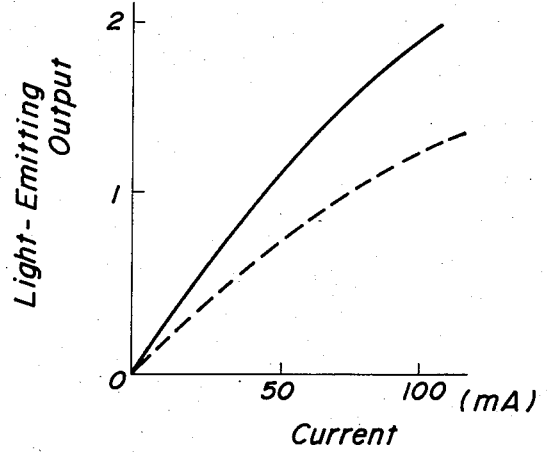
FIG. 9 is a current-light-emitting output characteristics diagram of the semiconductor light-emitting device.
Figure 10:
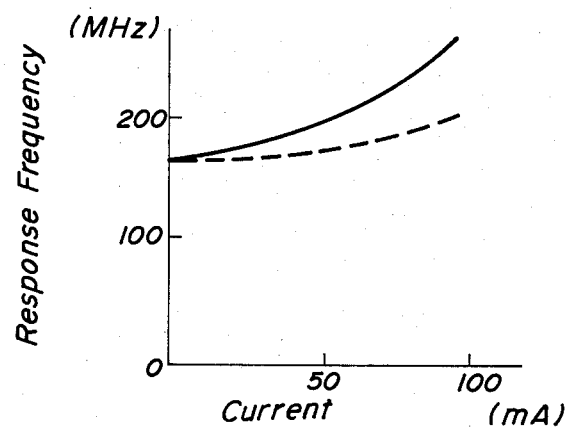
FIG. 10 is a current-response frequency characteristics diagram of the semiconductor light-emitting device.

FIG. 8 shows the carrier density profile of the layers of the semiconductor light-emitting device of FIG. 7, in which Zn of the p-$In_{1-x}Ga_xAs_{1-y}P_y$ active layer 4 is diffused as shown by the broken line and a p-n junction is formed in the neighborhood of the interface between the undoped $In_{1-x}Ga_xAs_{1-y}P_y$ active layer 3 and the n-InP clad layer 2. By the p-n junction formed in this manner, the injected carriers are confined completely within the $In_{1-x}Ga_xAs_{1-y}P_y$ active layer 3 and 4 without flowing out into the n-InP clad layer 2. For this reason, all the carriers contribute to emission of light. In fact, as shown in FIG. 9, the semiconductor light-emitting device according to the present invention provides a markedly larger light-emitting output shown by the solid line than that provided by the conventional semiconductor light-emitting device (shown by the broken line). FIG. 10 shows the relationship of the response frequency to the current flowing in the semiconductor light-emitting device. Since all the injected carriers are confined within the $In_{1-x}Ga_xAs_{1-y}P_y$ active layers 3 and 4 in the present device, the response frequency is much higher in the semiconductor light-emitting device according to the present invention (shown by the solid line) than in the conventional device (shown by the broken line) as shown in FIG. 10. Furthermore, the half value width (120 nm) of the light-emitting spectrum of the semiconductor light-emitting device according to the present invention shown by the curve (a) in FIG. 5 is much smaller than the half value width (160 nm) of that of the conventional device shown by the curve (b) in FIG. 5. Accordingly, as clearly seen from FIG. 6, the semiconductor light-emitting device according to the present invention provides a markedly increased transmittable distance.

In the present invention, the substrate and the layers thereon may take other values of thicknesses and carrier densities than those defined hereinabove with respect to the preferred emboidment. For example, the carrier density of the n-InP substrate 1 may be $1 \times 10^{18}$–$5 \times 10^{18}$ cm$^{-3}$ in which bulk resistance is low, the carrier density of the n-InP clad layer 2 may be $1 \times 10^{18}$–$5 \times 10^{18}$ cm$^{-3}$, and the dopant of said two layers may be Sn or S as well as Te. Further, the thickness of the n-InP clad layer 2 may be 2–20 μm which is easily controllable during growth of the crystal.

While the quantity of dopant of the p-$In_{1-x}Ga_xAs_{1-y}P_y$ active layer 4 is easy to control when the carrier density is made $1 \times 10^{18}$ cm$^{-3}$ or higher for high speed response, the control becomes difficult in the carrier density of $1 \times 10^{19}$ cm$^{-3}$ or higher because the depth of diffusion becomes too large. In the carrier density of $1 \times 10^{19}$ cm$^{-3}$ or higher, further, the crystal is distorted and light-emitting efficiency is reduced. Therefore, the preferred carrier density of the p-$In_{1-x}Ga_xAs_{1-y}P_y$ active layer 4 is $1 \times 10^{18}$–$1 \times 10^{19}$ cm$^{-3}$. While the thickness of the p-$In_{1-x}Ga_xAs_{1-y}P_y$ active layer 4 may be 0.1 μm or larger for easy control of the thickness of the epitaxial layer, the thickness is preferably 0.1-2 μm because the thickness of the layer is required to be equal to or smaller than the diffusion length of the minority carrier (normally in the order of 2 μm). The p-$In_{1-x}Ga_xAs_{1-y}P_y$ active layer is lattice-matched with the n-InP clad layer 2 and its band gap energy is in the range from 0.75 eV (for example, X=0.42, Y=0.10) to 1.2 eV (for example, X=0.09, Y=0.80) which is the low loss region of quartz fiber. The p-type dopant of the p-$In_{1-x}Ga_xAs_{1-y}P_y$ active layer 4 may be any of Cd, Mg and Be as well as Zn. During growth of crystal, the p-type dopant is diffused into the undoped $In_{1-x}Ga_xAs_{1-y}P_y$ active layer 3 and the depth of its diffusion is substantially proportional to the density of the p-type dopant and is dependent upon the kind of the dopant.

Figure 11A:
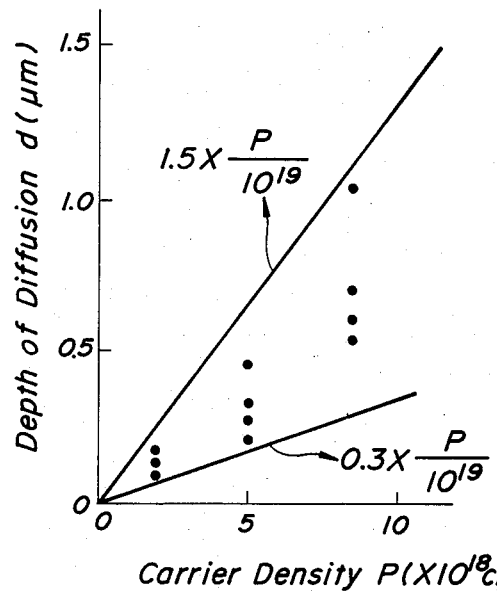
FIG. 11A is a graph showing the relationship between the depth of diffusion of a dopant within the undoped $In_{1-x}Ga_xAs_{1-y}P_y$ active layer during growth of crystal and the carrier density in the case where Zn is used as the p-type dopant.
Figure 11B:
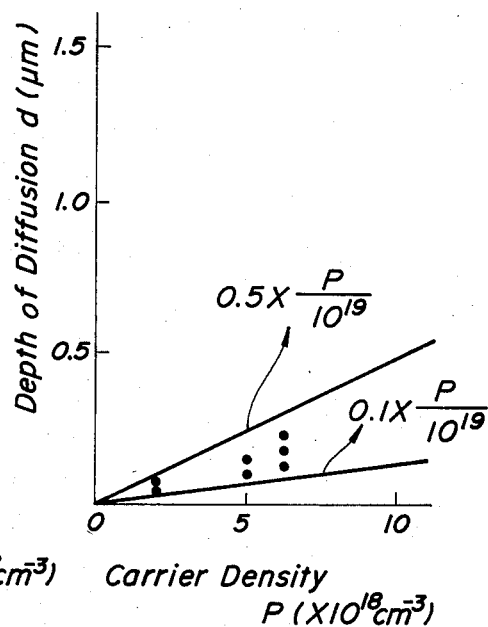
FIG. 11B is a graph showing the depth of diffusion of a dopant within the undoped $In_{1-x}Ga_xAs_{1-y}P_y$ active layer during growth of crystal and the carrier density in the case where any of Cd, Mg and Be is used as the p-type dopant.

FIGS. 11A and 11B show the relationship between the depth of diffusion of a dopant into the undoped $In_{1-x}Ga_xAs_{1-y}P_y$ active layer during growth of crystal and the carrier density. The depth of diffusion of Zn, which is a p-type dopant, shown in FIG. 11A is several times larger than the depth of diffusion of any of other p-type dopants, such as Cd, Mg and Be, shown in FIG. 11B.

Accordingly, the optimum value of the thickness of the undoped $In_{1-x}Ga_xAs_{1-y}P_y$ active layer 3 is dependent upon the kind and density of the p-type dopant of the $p-In_{1-x}Ga_xAs_{1-y}P_y$ active layer 4. Accordingly, assuming that the dopant of the $p-In_{1-x}Ga_xAs_{1-y}P_y$ active layer 4 is Zn and the carrier density of the active layer 4 is P, the optimum range of the thickness of the undoped $In_{1-x}Ga_xAs_{1-y}P_y$ active layer 3 is, as seen from FIG. 11A, from $0.3 \times (P/10^{19}) \mu m$ to $1.5 \times (P/10^{19}) \mu m$, and assuming that the dopant is any of Cd, Mg and Be, the optimum range of the thickness is, as seen from FIG. 11B, from $0.1 \times (P/10^{19}) \mu m$ to $0.5 \times (P/10^{19}) \mu m$, provided that the carrier density is defined as the number of carriers per cm$^3$. The carrier density of the undoped $In_{1-x}Ga_xAs_{1-y}P_y$ active layer 3 is preferably $1 \times 10^{17}$ cm$^{-3}$ or lower which is easily achievable and in which yield rate is high during growth of crystal. Further, the undoped $In_{1-x}Ga_xAs_{1-y}P_y$ active layer 3 is lattice-matched with the n-InP clad layer 2 and its band gap energy is selected in the range from 0.75 eV (for example, X=0.42, Y=0.10) to 1.2 eV (for example, X=0.09, Y=0.80) which is the low loss region of quartz fiber.

The carrier density of the p-InP clad layer 5 is taken to be substantially equal to the carrier density of the $p-In_{1-x}Ga_xAs_{1-y}P_y$ active layer 4, that is, in the range $1 \times 10^{18} - 1 \times 10^{19}$ cm$^{-3}$, and the thickness of the p-InP clad layer 5 is taken in the range 0.2–2.0 μm so as to efficiently confine the injected carriers within the undoped $In_{1-x}Ga_xAs_{1-y}P_y$ active layer 3 and the $p-In_{1-x}Ga_xAs_{1-y}P_y$ active layer 4. The carrier density of the $p-In_{1-w}Ga_wAs_{1-z}P_z$ contact layer 6 is taken in the range $1 \times 10^{18} - 1 \times 10^{19}$ cm$^{-3}$ so as to reduce the contact resistance with the p-side electrode metal. The thickness of the $p-In_{1-w}Ga_wAs_{1-z}P_z$ contact layer 6 is preferably in the range 0.1–1.0 μm.

In the foregoing description of the embodiment, while the undoped $In_{1-x}Ga_xAs_{1-y}P_y$ active layer 3 and $p-In_{1-x}Ga_xAs_{1-y}P_y$ active layer 4 have been described, the material of the device according to the present invention is not limited thereto but other materials such as $In_{1-x}Ga_xAs_{1-y}Sb_y/InSb$ (band gap from 0.35 eV to 0.70 eV) and $Ga_{1-x}Al_xAs_{1-y}Sb_y/GaSb$ (band gap from 0.70 eV to 1.60 eV) may be likewise utilized by liquid phase epitaxial growth or molecular beam epitaxial growth.

While only the preferred form of the invention has been described and shown, it should be understood that various changes or modification may be made within the scope of the appended claims without departing from the spirit of the invention.

What is claimed is:

1. In a semiconductor light-emitting device an arrangement comprising:
   an n-InP clad layer,
   an undoped $In_{1-x}Ga_xAs_{1-y}P_y$ active layer formed on said n-InP clad layer, and
   a $p-In_{1-x}Ga_xAs_{1-y}P_y$ active layer formed on said undoped $In_{1-x}Ga_xAs_{1-y}P_y$ active layer, a p-n junction being formed at an interface region between said n-InP layer and said undoped $In_{1-x}Ga_xAs_{1-y}P_y$ active layer.

2. An arrangement as set forth in claim 1 wherein said undoped $In_{1-x}Ga_xAs_{1-y}P_y$ active layer and said $p-In_{1-x}Ga_xAs_{1-y}P_y$ active layer are lattice-matched with said n-InP clad layer, respectively, and the band gap energy of each of said active layers is in the range from 0.75 eV to 1.2 eV.

3. An arrangement as set forth in claim 1, wherein the carrier density of said undoped $In_{1-x}Ga_xAs_{1-y}P_y$ active layer is $1 \times 10^{17}$ cm$^{-3}$ or lower, and the carrier density of said $p-In_{1-x}Ga_xAs_{1-y}P_y$ active layer is in the range from $1 \times 10^{18}$ cm$^{-3}$ to $1 \times 10^{19}$ cm$^{-3}$.

4. An arrangement as set forth in claim 1, wherein the thickness d of said undoped $In_{1-x}Ga_xAs_{1-y}P_y$ active layer is in the range defined by:

$$A(P/10^{19})\mu m \leq d \leq B(P/10^{19})\mu m$$

where P denotes the carrier density of said $p-In_{1-x}Ga_xAs_{1-y}P_y$ active layer, and the values of A and B are A=0.3, B=1.5 when Zn is used as the dopant of said $p-In_{1-x}Ga_xAs_{1-y}P_y$ active layer and A=0.1, B=0.5 when any of Cd, Mg and Be is used as said dopant, and the thickness of said $p-In_{1-x}Ga_xAs_{1-y}P_y$ active layer is in the range from 0.1 μm to 2.0 μm.

* * * * *